United States Patent
Park et al.

(10) Patent No.: US 11,118,260 B2
(45) Date of Patent: Sep. 14, 2021

(54) ZIRCONIUM ALLOY CLADDING WITH IMPROVED OXIDATION RESISTANCE AT HIGH TEMPERATURE AND METHOD FOR MANUFACTURING SAME

(71) Applicant: KOREA ATOMIC ENERGY RESEARCH INSTITUTE, Daejeon (KR)

(72) Inventors: Jung Hwan Park, Daegu (KR); Hyun Gil Kim, Daejeon (KR); Yang Il Jung, Daejeon (KR); Dong Jun Park, Daejeon (KR); Byoung Kwon Choi, Daejeon (KR); Young Ho Lee, Daejeon (KR); Jae Ho Yang, Sejong (KR)

(73) Assignee: KOREA ATOMIC ENERGY RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/762,247

(22) PCT Filed: Nov. 14, 2018

(86) PCT No.: PCT/KR2018/013879
§ 371 (c)(1),
(2) Date: May 7, 2020

(87) PCT Pub. No.: WO2019/098665
PCT Pub. Date: May 23, 2019

(65) Prior Publication Data
US 2020/0283885 A1 Sep. 10, 2020

(30) Foreign Application Priority Data

Nov. 14, 2017 (KR) .................. 10-2017-0151660

(51) Int. Cl.
| | | |
|---|---|---|
| *C23C 14/00* | (2006.01) | |
| *C23C 14/16* | (2006.01) | |
| *C23C 14/32* | (2006.01) | |
| *B32B 15/01* | (2006.01) | |
| *C22C 16/00* | (2006.01) | |
| *G21C 3/07* | (2006.01) | |
| *C23C 14/24* | (2006.01) | |
| *C23C 14/22* | (2006.01) | |

(52) U.S. Cl.
CPC .............. *C23C 14/16* (2013.01); *B32B 15/01* (2013.01); *C22C 16/00* (2013.01); *C23C 14/32* (2013.01); *C23C 14/325* (2013.01); *G21C 3/07* (2013.01); *C23C 14/00* (2013.01); *C23C 14/22* (2013.01); *C23C 14/24* (2013.01); *Y02E 30/30* (2013.01)

(58) Field of Classification Search
None
See application file for complete search history.

(56) References Cited

U.S. PATENT DOCUMENTS

| | | | |
|---|---|---|---|
| 9,761,424 B1 * | 9/2017 | Gorokhovsky | H01J 37/3266 |
| 2004/0022662 A1 * | 2/2004 | Lipkin | C23C 14/5806 |
| | | | 420/528 |

FOREIGN PATENT DOCUMENTS

| | | |
|---|---|---|
| JP | 61279675 | 12/1986 |
| JP | 2001192887 | 7/2001 |
| JP | 2003286564 | 10/2003 |
| KR | 20140001298 | 1/2014 |
| KR | 20160005819 A * | 1/2016 |
| KR | 20160046938 | 5/2016 |
| KR | 101779128 | 9/2017 |
| KR | 102011141 | 8/2019 |

OTHER PUBLICATIONS

Kim et al. "Development of Surface Modified Zr Cladding by Coating Technology for ATF". Top Fuel, Sep. 11-15, 2016 (Year: 2016).*
Hyun-Gil Kim et al., "Development of Surface Modified Zr Cladding by Coating Technology for ATF", Top Fuel 2016, Boise, ID, Sep. 11-15, 2016.
EPO, Search Report of 18878410.2, dated Jun. 25, 2021.
Duan Zhengang et al., "Current status of materials development of nuclear fuel cladding tubes for light water reactors", Nuclear Engineering and Design, vol. 316, Jan. 2, 2017 (Jan. 2, 2017), pp. 131-150, XP029977729, ISSN: 0029-5493, DOI: 10.1016/J.NUCENGDES.2017.02.031.

* cited by examiner

*Primary Examiner* — Jose I Hernandez-Kenney
(74) *Attorney, Agent, or Firm* — Lex IP Meister, PLLC

(57) ABSTRACT

The present invention relates to a zirconium alloy cladding with improved oxidation resistance at a high temperature and a method of manufacturing the same. More particularly, the zirconium alloy cladding includes a zirconium alloy cladding; and a Cr—Al thin film coated on the cladding, wherein the thin film is deposited through arc ion plating and the content of Al in the thin film is 5% by weight to 20% by weight.

4 Claims, 11 Drawing Sheets

ZIRCONIUM ALLOY CLADDING WITH IMPROVED OXIDATION RESISTANCE AT HIGH TEMPERATURE AND METHOD FOR MANUFACTURING SAME

TECHNICAL FIELD

The present invention relates to a zirconium alloy cladding with improved oxidation resistance at a high temperature and a method of manufacturing the same.

BACKGROUND ART

Since zirconium alloys have excellent oxidation resistance and mechanical properties under normal operating conditions, they are used as nuclear fuel cladding materials for protecting nuclear fuel from the outside in light water reactors. However, since zirconium alloys undergo rapid oxidation in a high-temperature steam atmosphere and generate a large amount of heat with hydrogen, safety issues have always been raised. In particular, after the hydrogen explosion occurred due to oxidation of nuclear fuel cladding by high-temperature steam in the Fukushima nuclear power plant accident in Japan, studies to secure safety in the event of a nuclear fuel cladding accident are being actively conducted.

To secure the safety of nuclear fuel cladding, a nuclear fuel cladding manufactured with a material having excellent oxidation resistance at a high temperature is used instead of a zirconium alloy. As candidate materials for nuclear fuel cladding, SiC/SiCf composites, FeCrAl alloys, Ti—Al alloys, Mo materials, and the like are being developed. However, SiC has been confirmed to be soluble in water under normal operating conditions and has the disadvantage of high technical difficulty. In addition, the other alloys have a higher thermal neutron absorption cross section than Zr, resulting in poor economic efficiency.

As another method of securing the stability of nuclear fuel cladding, there is a method of coating the surface of an existing nuclear fuel cladding made of a zirconium alloy with a material with excellent oxidation resistance. Since this method uses an existing zirconium alloy as it is, it is easy to apply to commercial reactors, and manufacturing costs are lower than the aforementioned method. Accordingly, research into applying coating technology to the development of resistance-enhanced fuel is being actively conducted throughout the world.

The Korea Atomic Energy Research Institute also conducted research on FeCrAl and Cr, which were previously studied as coating materials, and new alloys. In the case of FeCrAl alloys, Fe diffuses into a Zr base material at a high temperature to form a Zr—Fe-based intermetallic compound, which results in weakened brittleness. In addition, it has been observed that FeCrAl alloys have low impact strength due to low ductility of Cr, and oxygen ions diffuse along grain boundaries, when oxidized at a high temperature, to form an oxygen-stabilized alpha-Zr ($\alpha$-Zr (O)) layer on a surface of a Zr base material.

RELATED ART DOCUMENT

Patent Document

Korean Patent Application Publication No. 10-2016-0005819 (Jan. 18, 2016)

DISCLOSURE

Technical Problem

Therefore, the present invention has been made in view of the above problems, and it is one object of the present invention to provide a zirconium alloy cladding with improved oxidation resistance at a high temperature, the zirconium alloy cladding including a zirconium alloy cladding; and a Cr—Al thin film coated on the cladding, wherein the thin film is deposited through arc ion plating and the content of Al in the thin film is 5% by weight to 20% by weight.

It will be understood that technical problems of the present invention are not limited to the aforementioned problems and other technical problems not referred to herein will be clearly understood by those skilled in the art from disclosures below.

Technical Solution

In accordance with an aspect of the present invention, the above and other objects can be accomplished by the provision of a zirconium alloy cladding with improved oxidation resistance at a high temperature, including a zirconium alloy cladding; and a Cr—Al thin film coated on the cladding, wherein the thin film is deposited through arc ion plating and the content of Al in the thin film is 5% by weight to 20% by weight.

In accordance with another aspect of the present invention, there is provided a method of manufacturing a zirconium alloy cladding with improved oxidation resistance at a high temperature, the method including: (a) a step of manufacturing a target including Cr and Al; and (b) a step of depositing a Cr—Al thin film on a zirconium alloy cladding through arc ion plating in which a current and bias voltage are applied to the target, wherein the content of Al in the target is 7% by weight to 23% by weight.

Advantageous Effects

As apparent from the above description, the present invention provides a zirconium alloy with improved oxidation resistance at a high temperature, including a zirconium alloy cladding; and a Cr—Al thin film coated on the cladding, wherein the thin film is deposited through arc ion plating and the content of Al in the thin film is 5% by weight to 20% by weight. Accordingly, the Cr—Al thin film does not peel off from an interface while exhibiting excellent oxidation resistance even under high-temperature accident conditions as well as under normal operating conditions, problems due to cracks or droplets generated in the Cr—Al thin film can be addressed, and surface roughness can be reduced.

In addition, a method of manufacturing a zirconium alloy with improved oxidation resistance at a high temperature according to the present invention includes a step of depositing a Cr—Al thin film on a zirconium alloy cladding through arc ion plating in which a current and bias voltage are applied to a target including Cr and Al. Here, a deposition rate can also be improved by optimizing deposition conditions, thereby increasing economic efficiency.

Therefore, it is expected to greatly increase the stability and economic efficiency of nuclear power generation.

MODES OF THE INVENTION

Figure 1:
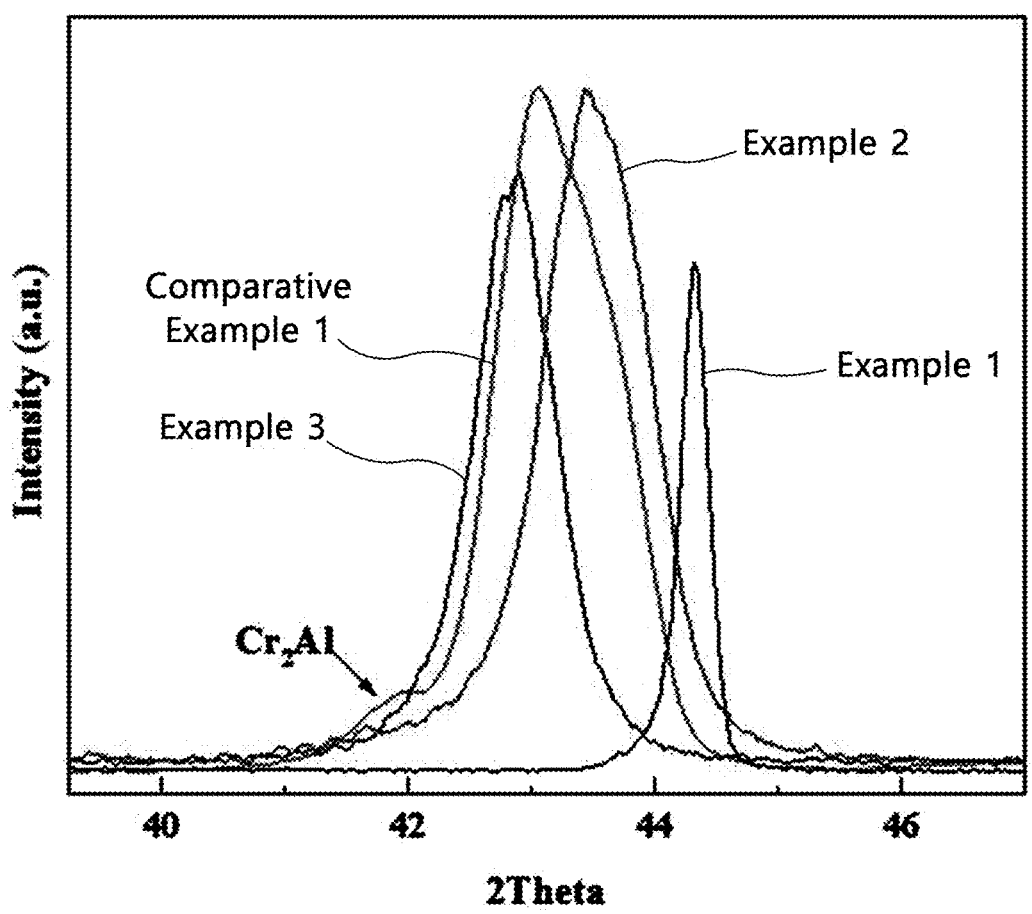
FIG. 1 illustrates an XRD pattern analysis result of a Cr—Al thin film in a cladding, made of Cr—Al thin film-deposited Zircaloy-4, according to each of Examples 1 to 3 and Comparative Example 1.

The present inventors have confirmed that, when a Cr—Al thin film (the content of Al in the thin film=5 to 20% by weight) is deposited on a zirconium alloy cladding through arc ion plating to improve oxidation resistance of the zirconium alloy cladding at a high temperature, the Cr—Al thin film does not peel off from an interface or the Cr—Al thin film is not cracked, thus completing the present invention.

Hereinafter, the present invention will be described in detail.

Zirconium Alloy Cladding with Improved Oxidation Resistance at High Temperature

The present invention provides a zirconium alloy cladding with improved oxidation resistance at a high temperature, including a zirconium alloy cladding; and a Cr—Al thin film coated on the cladding, wherein the thin film is deposited through arc ion plating and the content of Al in the thin film is 5% by weight to 20% by weight.

First, the zirconium alloy cladding with improved oxidation resistance at a high temperature according to the present invention includes a zirconium alloy cladding as a base material.

The zirconium alloy is used as a nuclear fuel cladding material for protecting nuclear fuel from the outside in light water reactors. The zirconium alloy may include one or more selected from the group consisting of Zircaloy-4, Zircaloy-2, ZILRO, M5, HANA, optimized-ZILRO, and E110, preferably Zircaloy-4, but the present invention is not limited thereto.

Particularly, Zircaloy-4 and Zircaloy-2 are mainly used as nuclear fuel cladding materials in commercial power plants, and ZILRO, M5, HANA, optimized-ZILRO and E110, which have further improved corrosion resistance, are used as nuclear fuel cladding materials in recently developed commercial power plants, and specific compositions are as follows:

Zircaloy-4: 1.20% to 1.70% Sn; 0.18% to 0.24% Fe; 0.07% to 1.13% Cr; 900 ppm to 1500 ppm O; less than 0.007% Ni; and the remainder being Zr.

Zircaloy-2: 1.20% to 1.70% Sn; 0.07% to 0.20% Fe; 0.05% to 1.15% Cr; 0.03% to 0.08% Ni; 900 ppm to 1500 ppm O; and the remainder being Zr.

ZILRO: 0.5% to 2.0% Nb; 0.7% to 1.5% Sn; 0.07% to 0.28% of at least one component selected from Fe, Co, Ni, and Cr; up to 200 ppm C; and the remainder being Zr.

M5: 0.8% to 1.2% Nb; 0.090% to 0.149% 0; 200 ppm to 1000 ppm Fe; and the remainder being Zr.

HANA: about 1.1% Nb; about 0.05% Cu; and the remainder being Zr.

Optimized-ZILRO: 0.8% to 1.2% Nb; 0.6% to 0.9% Sn; 0.090% to 0.13% Fe; 0.105% to 0.145% O; and the remainder being Zr.

E110: about 1.0% Nb; and the remainder being Zr.

Next, the zirconium alloy cladding with improved oxidation resistance at a high temperature according to the present invention includes a Cr—Al thin film, wherein the thin film is coated on the cladding. Such a thin film form has the advantage of being capable of reducing the thermal neutron absorption cross section and thus securing economic efficiency. Meanwhile, the thin film is deposited through arc ion plating, and the content of Al in the thin film is 5% by weight to 20% by weight.

The thin film coated on the cladding includes Cr and Al as elements. This thin film may additionally include unavoidable impurities as other elements.

Particularly, Cr, which is a transition metal, makes a crystal growth direction of a zirconium oxide film irregular, but prevents the oxide film from growing in only one direction, thereby suppressing the sudden breakdown of the oxide film. In addition, an oxide film of chromium oxide such as $Cr_2O_3$ is formed, and thus, oxidation resistance is exhibited from room temperature to a high temperature. In addition, since Al forms a $A_2O_3$ oxide film stable at a high temperature, particularly under nuclear accident conditions, when oxidized and has a thermal neutron absorption cross section of 0.233 barn that is 3.1 barn smaller than that of Cr, a thermal neutron absorption cross section of the thin film may be reduced with an increasing content of Al, and thus, a nuclear fuel cycle may be increased.

The content of Al in the thin film may be 5% by weight to 20% by weight, preferably 7% by weight to 18% by weight, but the present invention is not limited thereto. Here, when the content of Al in a thin film is too low, oxidation resistance at high temperature may be decreased, and an oxygen-stabilized alpha-Zr ($\alpha$-Zr(O)) layer may be formed on a surface of the zirconium alloy cladding due to oxygen infiltration. When the content of Al in a thin film is too high, an intermetallic compound may be generated in the thin film. Since a thermal expansion rate difference between the intermetallic compound and the zirconium alloy increases at a high temperature, a thin film may be separated from an interface or cracked.

To allow the thin film to be satisfactorily deposited on the zirconium alloy cladding, it is preferred that an intermetallic compound, such as a $Cr_2Al$ compound or $Cr_8Al_5$ compound, is not generated in the thin film. Since a thermal expansion rate difference between the intermetallic compound and the zirconium alloy increases at a high temperature, the thin film may be separated from an interface or cracked. In addition, it is required to minimize generation of droplets in the thin film. The thickness of thin film is preferably 5 µm to 100 µm, but the present invention is not limited thereto. When the thickness of the thin film is less than 5 µm, the weight may greatly increase under high-temperature steam conditions. In addition, some thin films may fall off due to abrasion or wear during nuclear fuel assembly or nuclear power plant operation, and thus, a surface of the zirconium alloy cladding surface may be exposed. On the other hand, when the thickness of the thin film exceeds 100 µm, the thermal neutron absorption cross section of the thin film may increase, and thus, a nuclear fuel cycle may be reduced.

In addition, the thin film has excellent oxidation resistance even under high-temperature accident conditions as well as under normal operating conditions. When the thin film was oxidized at 1200° C. for 2,000 seconds under a steam atmosphere condition, a weight increase amount may be 1 mg/dm$^2$ to 3,000 mg/dm$^2$, preferably 1 mg/dm$^2$ to 2,000 mg/dm$^2$, but the present invention is not limited thereto.

Further, the thin film is characterized by having reduced surface roughness. Particularly, a surface roughness (Ra) of the thin film may be maintained at 5 µm or less without undergoing a separate polishing process.

Method of Manufacturing Zirconium Alloy Cladding with Improved Oxidation Resistance at High Temperature The present invention provides a method of manufacturing a zirconium alloy cladding with improved oxidation resistance at a high temperature, the method including (a) a step of manufacturing a target including Cr and Al; and (b) a step of depositing a Cr—Al thin film on a zirconium alloy cladding through arc ion plating in which a current and bias voltage are applied to the target, wherein the content of Al in the target is 7% by weight to 23% by weight.

First, the method of manufacturing a zirconium alloy cladding with improved oxidation resistance at a high temperature according to the present invention includes a step of manufacturing a target including Cr and Al [step (a)].

The target, which is a starting material for manufacturing a Cr—Al thin film, may be, particularly, a mixed form of Cr and Al or a Cr—Al alloy form. The target may be manufactured by a known method. After mixing Cr and Al, a dissolution method, hot pressing, hot isostatic pressing (HIP), spark plasma sintering (SPS), etc. may be used.

The target should be manufactured in a vacuum state to prevent oxidation before deposition. Here, the vacuum state may be $1\times10^{-6}$ Torr to $1\times10^{-5}$ Torr.

Particularly, the content of Al in the thin film may be controlled to 5% by weight to 20% by weight by maintaining the content of Al in the target at 7% by weight to 23% by weight. More particularly, the content of Al in the thin film may be controlled to 7% by weight to 18% by weight by maintaining the content of Al in the target at 10% by weight to 20% by weight.

Next, the method of manufacturing a zirconium alloy cladding with improved oxidation resistance at a high temperature according to the present invention includes the step of depositing a Cr—Al thin film on a zirconium alloy cladding through arc ion plating in which a current and bias voltage are applied to the target [step (b)].

As general deposition (or coating) techniques, there are chemical vapor deposition (CVD), cold spray coating, physical vapor deposition (PVD), etc. In the case of CVD, it is easy to form a coating film with a uniform thickness, but a deposition temperature used to form a coating film is very high, which may cause a phase change or transformation of a zirconium base material. In the case of cold spray coating, a deposition rate is very high, but the density of the coating film is low, which makes it difficult to use as nuclear fuel cladding coating technology. In the case of PVD, deposition may be performed even at a low temperature and a coating density is close to a theoretical density. Accordingly, it is actively researched to develop accident-resistant nuclear fuel cladding. However, PVD has a disadvantage of inconsistency between a target composition and a thin film composition because a deposition rate thereof is slower than those of other methods and a sputter yield is different according to atomic weight differences of target constituent elements. In addition, a polycrystalline structure or an amorphous structure may be formed depending upon deposition conditions, a structure of thin film appears in various forms such as a porous structure, a dense structure, a columnar structure, a coarse structure, etc., and the film structure affects properties. Accordingly, it is necessary to optimize deposition conditions to improve oxidation resistance at high temperature.

Arc ion plating used in the present invention may be seen as a kind of the aforementioned physical vapor deposition. Accordingly, in the arc ion plating performing atomic-level deposition by applying a current and bias voltage, it is important to optimize deposition conditions.

The applied current may be 30 A to 120 A, and the applied bias voltage may be 100 V to 400 V. Particularly, the applied current is preferably 60 A to 120 A, more preferably 80 A to 100 A, but the present invention is not limited thereto. Here, when the value of the applied current is too small, a deposition rate may be decreased. When the value of the applied current is too large, the size and number of droplets generated in a Cr—Al thin film may increase. In addition, the applied bias voltage is preferably 100 V to 400 V, more preferably 100 V to 300 V, but the present invention is not limited thereto. Here, when the applied bias voltage is less than 100 V, oxidation resistance at high temperature is decreased, and a Cr—Al thin film peels off from an interface. When the bias voltage exceeds 400 V, a deposition rate is significantly decreased.

In general, an acceleration rate is decreased with an increasing size of a material to be evaporated during deposition. Accordingly, the possibility that the evaporated material does not reach a substrate increases due to collisions with gas molecules. Accordingly, the probability that ions and droplets generated in a target collide with gas molecules may be increased by increasing a working pressure during deposition. Therefore, the working pressure during the deposition is maintained preferably at 5 mTorr to 50 mTorr, more preferably 5 mTorr to 20 mTorr, but the present invention is not limited thereto. Here, when the working pressure is less than 5 mTorr during the deposition, surface roughness and droplets excessively increase.

In addition, the deposition may be performed at 200° C. to 300° C. Here, when the deposition temperature is less than 200° C., the quality of a thin film may be decreased due to organic impurities. When the deposition temperature exceeds 300° C., mechanical properties may be decreased due to a phase change of a zirconium base material.

In addition, the deposition may be performed at a rate of 2 μm/h to 15 μm/h. Here, when the deposition rate is less than 2 μm/h, a deposition time may increase. When the deposition rate exceeds 15 μm/h, droplets may be generated due to high-current arc heat.

Accordingly, when the deposited thin film is oxidized at 1200° C. for 2,000 seconds under a steam atmosphere condition, a weight increase amount may be 1 mg/dm$^2$ to 3,000 mg/dm$^2$, preferably 1 mg/dm$^2$ to 2,000 mg/dm$^2$, but the present invention is not limited thereto.

Further, the deposited thin film is characterized by having reduced surface roughness. An arithmetical average roughness (Ra) of the thin film may be maintained at 5 μm or less even without undergoing a separate polishing process. Accordingly, the arithmetical average roughness (Ra) of the deposited thin film may be further lowered through an additional polishing process.

As described above, the present invention provides a zirconium alloy with improved oxidation resistance at a high temperature, including a zirconium alloy cladding; and a Cr—Al thin film coated on the cladding, wherein the thin film is deposited through arc ion plating and the content of Al in the thin film is 5% by weight to 20% by weight. Accordingly, the Cr—Al thin film does not peel off from an interface while exhibiting excellent oxidation resistance even under high-temperature accident conditions as well as under normal operating conditions, problems due to cracks or droplets generated in the Cr—Al thin film can be addressed, and surface roughness can be reduced.

In addition, a method of manufacturing a zirconium alloy with improved oxidation resistance at a high temperature according to the present invention includes a step of depositing a Cr—Al thin film on a zirconium alloy cladding through arc ion plating in which a current and bias voltage are applied to a target including Cr and Al. Here, a deposition rate may also be improved by optimizing deposition conditions, thereby increasing economic efficiency.

Therefore, it is expected to greatly increase the stability and economic efficiency of nuclear power generation.

Now, the present invention will be described in more detail with reference to the following preferred examples. These examples are provided for illustrative purposes only and should not be construed as limiting the scope and spirit of the present invention.

EXAMPLES

Example 1

A target including Cr and Al was manufactured by a known method. Here, the content of Al in the target was 10% by weight. To prevent the target from being oxidized before deposition, a vacuum state of $1\times10^{-6}$ Torr to $1\times10^{-5}$ Torr was prepared, and then argon (Ar), as a carrier gas, was injected, followed by setting a working pressure of 5 to 20 mTorr. A 50 μm-thick Cr—Al thin film was deposited on a cladding made of Zircaloy-4 through arc ion plating in which a current of 90 A and a bias voltage of 150 V were applied to a target. As an EDX analysis result of the Cr—Al thin film, the content of Al in the thin film was confirmed to be 7.3% by weight.

Example 2

A Cr—Al thin film was deposited on a cladding made of Zircaloy-4 in the same manner as in Example 1, except that the content of Al in the target was 15% by weight. As an EDX analysis result of the Cr—Al thin film, the content of Al in the thin film was confirmed to be 11.4% by weight.

Example 3

A Cr—Al thin film was deposited on a cladding made of Zircaloy-4 in the same manner as in Example 1, except that the content of Al in the target was 20% by weight. As an EDX analysis result of the Cr—Al thin film, the content of Al in the thin film was confirmed to be 17.8% by weight.

Comparative Example 1

A Cr—Al thin film was deposited on a cladding made of Zircaloy-4 in the same manner as in Example 1, except that the content of Al in the target was 25% by weight. As an EDX analysis result of the Cr—Al thin film, the content of Al in the thin film was confirmed to be 21.1% by weight.

Comparative Example 2

A cladding made of Zircaloy-4, on which a thin film was not separately deposited, was prepared.

Comparative Example 3

A cladding made of Zircaloy-4, on which a 50 μm-thick Cr thin film was deposited, was prepared.

FIG. 1 illustrates an XRD pattern analysis result of a Cr—Al thin film in a cladding, made of Cr—Al thin film-deposited Zircaloy-4, according to each of Examples 1 to 3 and Comparative Example 1.

As shown in FIG. 1, in the case of Examples 1 to 3, the content of Al in the target was confirmed to be 10 to 20% by weight (i.e., the content of Al in the thin film was about 7 to 18% by weight), and the XRD pattern analysis results of the Cr—Al thin films showed that intermetallic compounds were not separately generated. However, in the case of Comparative Example 1, the content of Al in the target was confirmed to be 25% by weight (i.e., the content of Al in the thin film was about 21% by weight), and the XRD pattern analysis result of the Cr—Al thin film showed that the lattice constant (110) increased with an increasing content of the substituted Al because the atomic size of Al is larger than the atomic size of Cr, and thus, a peak moved toward a lower angle. That is, it was confirmed that a $Cr_2Al$ compound was generated. Since a thermal expansion rate difference between an intermetallic compound, such as the $Cr_2Al$ compound, and Zircaloy-4 increases at a high temperature, the Cr—Al thin film may be separated from an interface or cracked.

Figure 2:
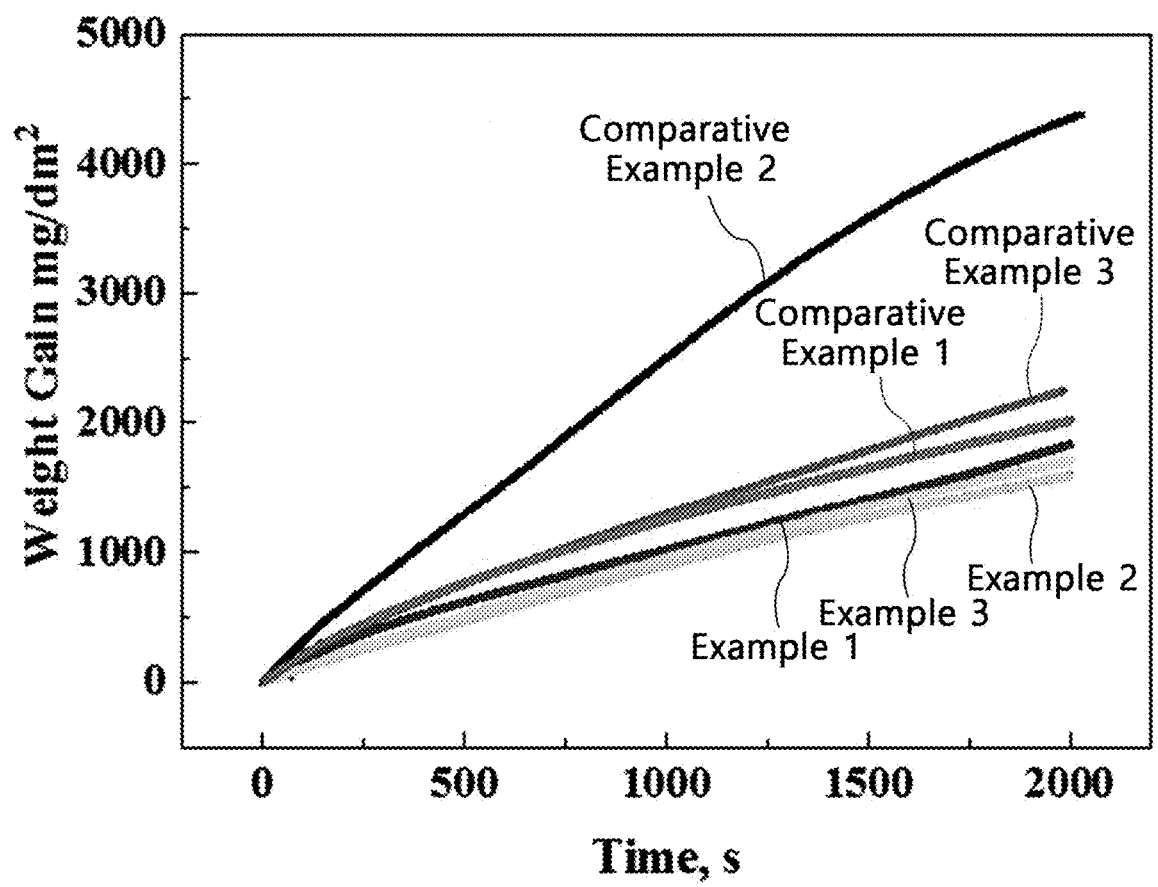
FIG. 2 illustrates a comparison result of weight increase amounts due to oxidization of cladding, made of Zircaloy-4 according to Examples 1 to 3 and Comparative Examples 1 to 3, at 1200° C. for 2,000 seconds under a steam atmosphere condition.

FIG. 2 illustrates a comparison result of weight increase amounts due to oxidization of cladding, made of Zircaloy-4, according to Examples 1 to 3 and Comparative Examples 1 to 3, at 1200° C. for 2,000 seconds under a steam atmosphere condition.

As shown in FIG. 2, in the case of Comparative Example 2, a separate thin film was not deposited, and thus, a weight increase amount under a high-temperature steam condition was relatively large. However, when a thin film with oxidation resistance at high temperature was deposited as in Examples 1 to 3 and Comparative Examples 1 and 3, a weight increase amount under a high-temperature steam condition was confirmed to be relatively small. In particular, when the content of Al in the target was 10 to 20% by weight (i.e., the content of Al in the thin film was about 7 to 18% by weight) as in Examples 1 to 3, weight increase amounts under the high-temperature steam condition were much smaller than in Comparative Examples 1 to 3.

Figure 3:
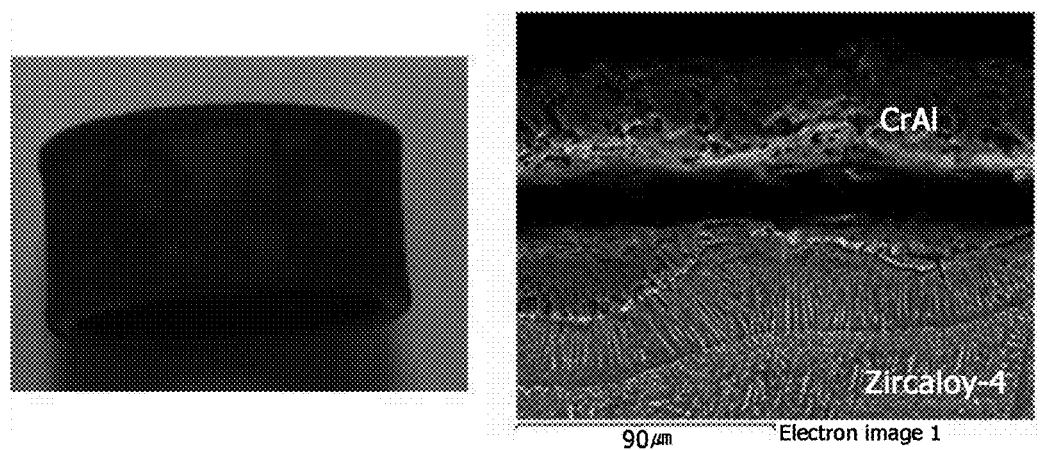
FIG. 3 illustrates, after oxidizing a cladding, made of Cr—Al thin film-deposited Zircaloy-4, according to Comparative Example 1, at 1200° C. for 2,000 seconds under a steam atmosphere condition, an appearance photograph of the cladding and a SEM photograph of a cross section thereof.

FIG. 3 illustrates, after oxidizing a cladding, made of Cr—Al thin film-deposited Zircaloy-4, according to Comparative Example 1, at 1200° C. for 2,000 seconds under a steam atmosphere condition, an appearance photograph of the cladding and a SEM photograph of a cross section thereof.

As shown in FIG. 3, in the case of Comparative Example 1, the content of Al in the target was confirmed to be 25% by weight (i.e., the content of Al in the thin film was about 21% by weight). Examining the appearance, the Cr—Al thin film was observed to be corroded. Examining the cross section, a $Cr_2Al$ compound was observed as an intermetallic compound in the Cr—Al thin film.

Figure 4:
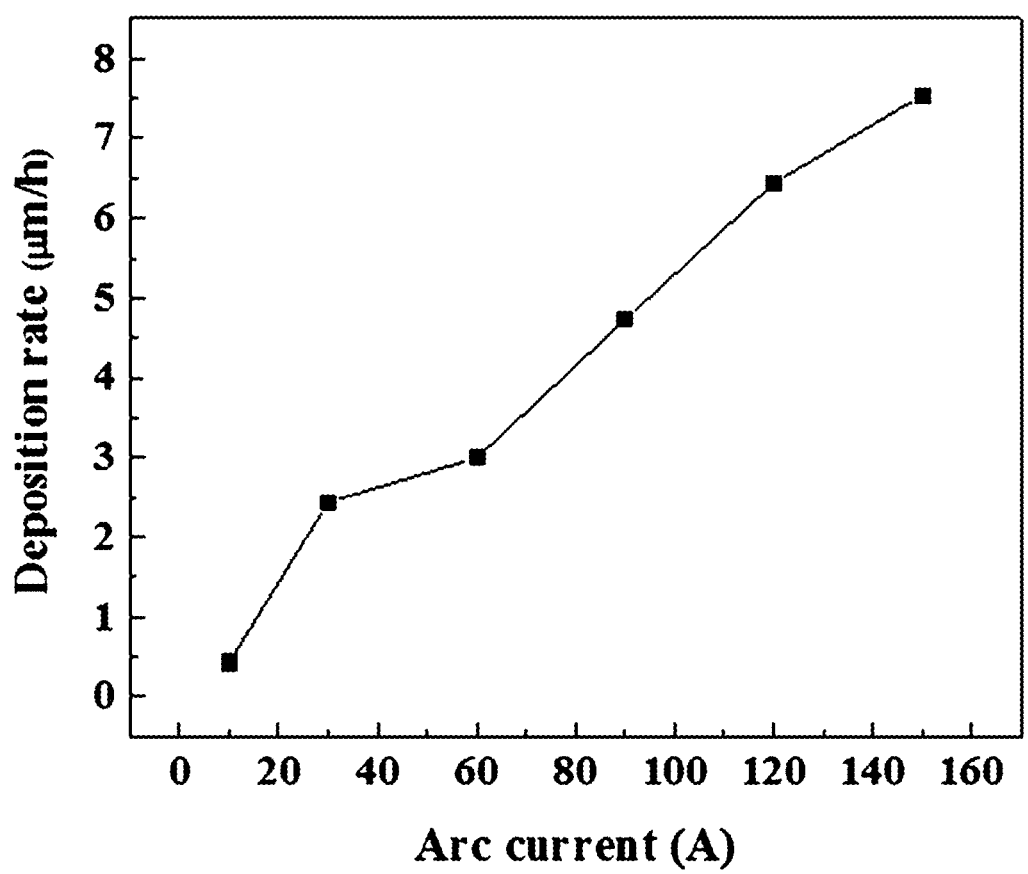
FIG. 4 illustrates a deposition rate measurement result when a Cr—Al thin film was deposited on a cladding made of Zircaloy-4 in the same manner as in Example 1 while variously adjusting an applied current in a range from 10 to 150 A during arc ion plating in a state in which a bias voltage applied to a target was fixed at 300 V.

FIG. 4 illustrates a deposition rate measurement result when a Cr—Al thin film was deposited on a cladding made of Zircaloy-4 in the same manner as in Example 1 while variously adjusting an applied current in a range from 10 to 150 A during arc ion plating in a state in which a bias voltage applied to a target was fixed at 300 V.

As shown in FIG. 4, it was confirmed that the deposition rate tended to increase as a current value applied to the target increased during arc ion plating.

Figure 5:
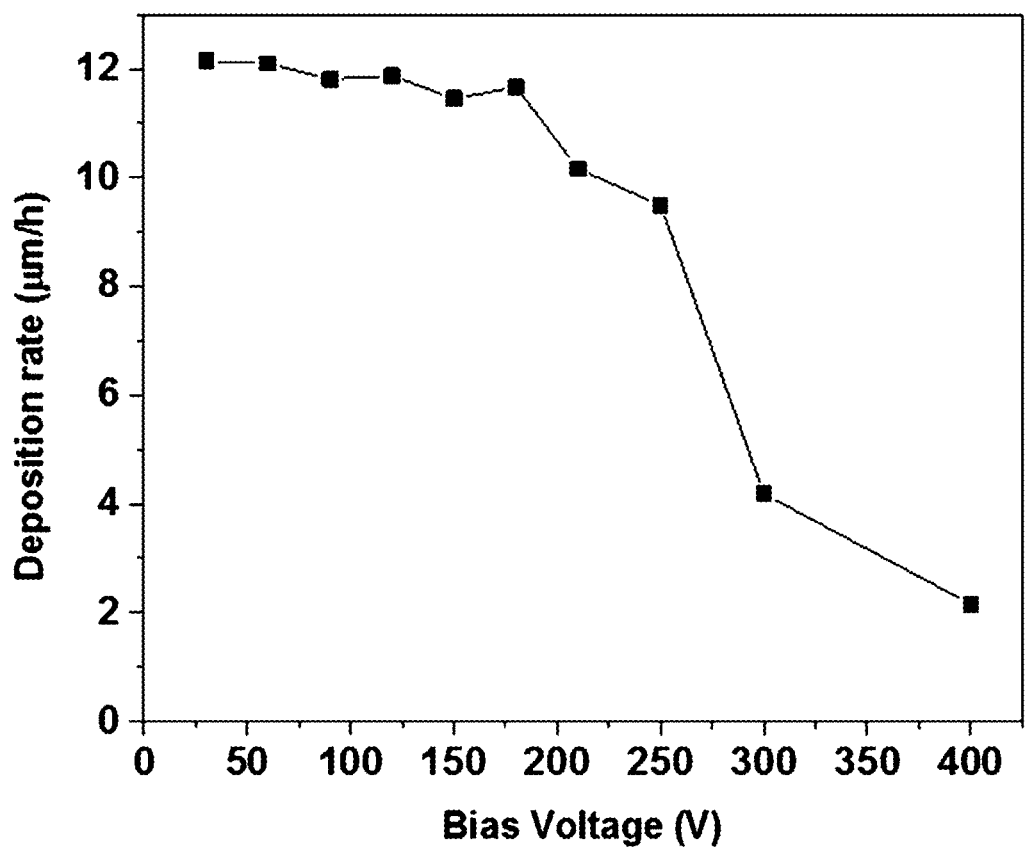
FIG. 5 illustrates a deposition rate measurement result when a Cr—Al thin film was deposited on a cladding made of Zircaloy-4 in the same manner as in Example 1 while variously adjusting an applied bias voltage in a range from 30 to 400 A during arc ion plating in a state in which a current applied to a target was fixed at 90 A.

In addition, FIG. 5 illustrates a deposition rate measurement result when a Cr—Al thin film was deposited on a cladding made of Zircaloy-4 in the same manner as in Example 1 while variously adjusting an applied bias voltage in a range from 30 to 400 V during arc ion plating in a state in which a current applied to a target was fixed at 90 A.

As shown in FIG. 5, it was confirmed that the deposition rate tended to increase as a voltage value applied to a target was decreased during arc ion plating. In particular, when a bias voltage applied to the target during arc ion plating was 30 to 400 V, the deposition rate was confirmed to be about 2 to 12 μm/h, but, when a bias voltage applied to the target during arc ion plating was greater than 400 V, the deposition rate was confirmed to be significantly decreased.

With reference to FIGS. 4 and 5, Table 1 shows deposition rate measurement results when a Cr—Al thin film was deposited on a cladding made of Zircaloy-4 in the same manner as in Example 1 while a current and bias voltage applied to a target during arc ion plating were variously adjusted.

TABLE 1

|  |  | Deposition rate (μm/h) Bias voltage | | | | | | |
|---|---|---|---|---|---|---|---|---|
|  |  | 50 V | 100 V | 150 V | 200 V | 250 V | 300 V | 400 V |
| Current | 30 A | — | — | 3.1 | — | — | 2.44 | — |
|  | 60 A | — | — | 7.4 | — | — | 3.3 | 2.2 |
|  | 90 A | 12.15 | 12.1 | 11.4 | 11.6 | 9.4 | 4.78 | 2.1 |
|  | 120 A | — | — | 14.6 | — | — | 6.44 | 4.6 |
|  | 150 A | — | — | 17.7 | — | — | 6.74 | 1.6 |

As shown in Table 1, it was confirmed that an optimized deposition rate was provided when an applied bias voltage was adjusted to 250 V or less while adjusting a current, applied to the target, to 60 A or more during arc ion plating.

Figure 6A:
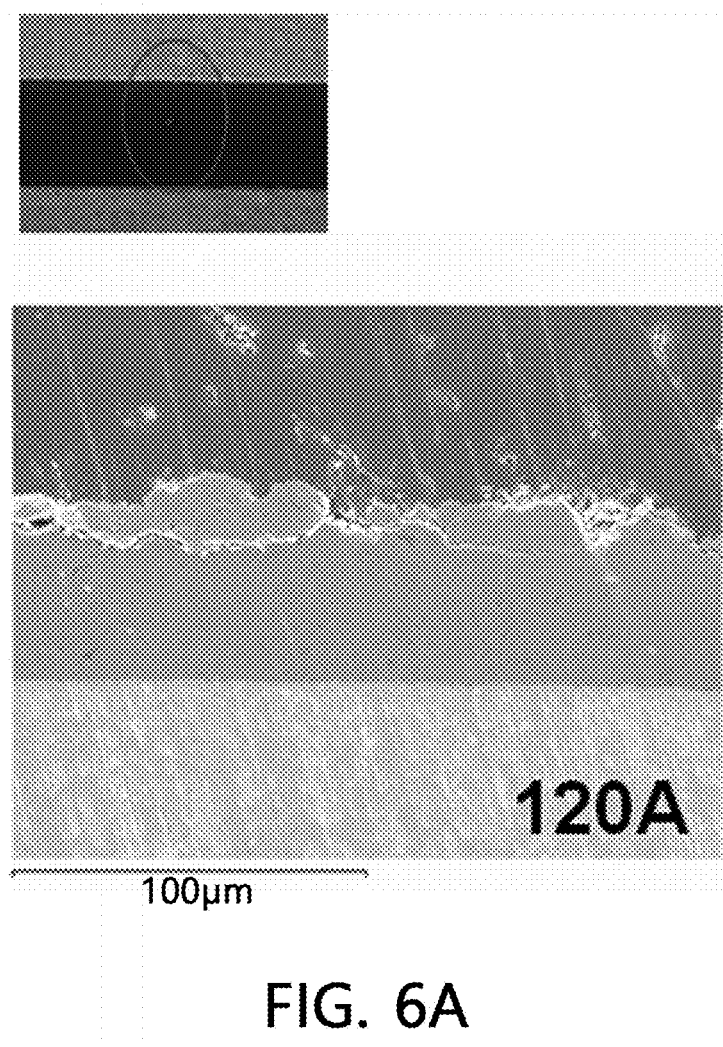
FIGS. 6A and 6B illustrate, when a Cr—Al thin film was deposited on a cladding made of Zircaloy-4 in the same manner as in Example 1, but a current was adjusted to 120 A or 150 A in a state in which a bias voltage applied to a target during arc ion plating was fixed at 150 V, an appearance photograph of the cladding, made of Cr—Al thin film-deposited Zircaloy-4 and a SEM photograph of a cross section thereof.
Figure 6B:
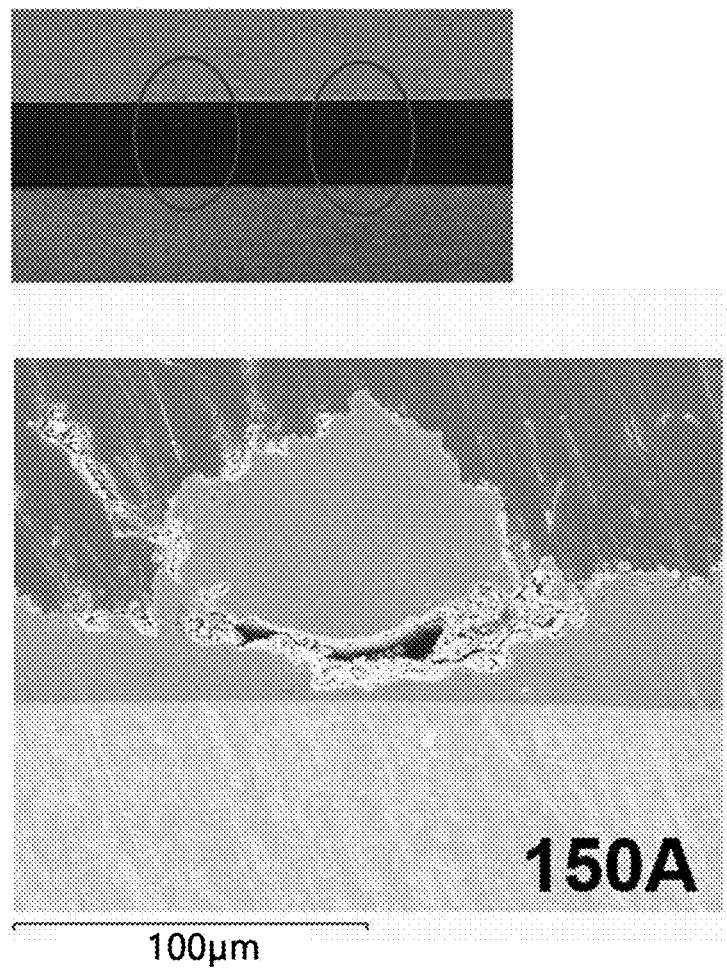

FIG. 6 illustrates, when a Cr—Al thin film was deposited on a cladding made of Zircaloy-4 in the same manner as in Example 1, but a current was adjusted to 120 A or 150 A in a state in which a bias voltage applied to a target during arc ion plating was fixed at 150 V, an appearance photograph of the cladding, made of Cr—Al thin film-deposited Zircaloy-4, and a SEM photograph of a cross section thereof.

As shown in FIG. 6, it was confirmed that, when a current value applied to a target during arc ion plating exceeded 120 A, the size and number of droplets generated in a Cr—Al thin film increased.

Figure 7:
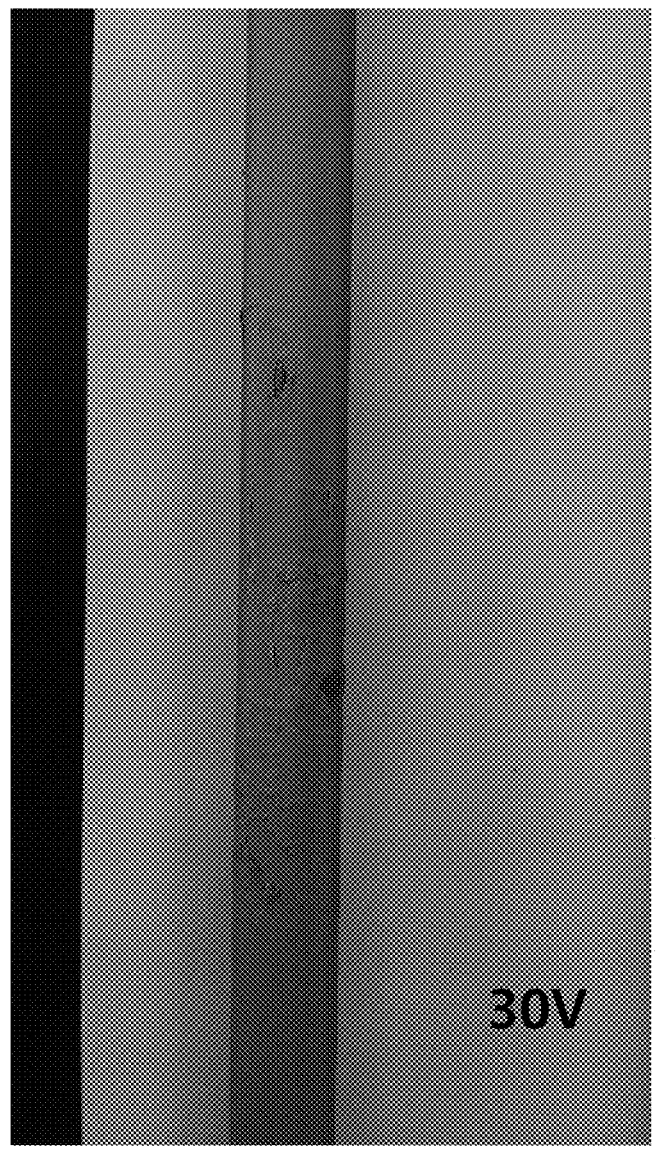
FIG. 7 illustrates, when a Cr—Al thin film was deposited on a cladding made of Zircaloy-4 in the same manner as in Example 1, but an applied bias voltage was adjusted to 30 V in a state in which a current applied to a target during arc ion plating was fixed at 90 A, an appearance photograph of the cladding, made of Cr—Al thin film-deposited Zircaloy-4.

FIG. 7 illustrates, when a Cr—Al thin film was deposited on a cladding made of Zircaloy-4 in the same manner as in Example 1, but an applied bias voltage was adjusted to 30 V in a state in which a current applied to a target during arc ion plating was fixed at 90 A, an appearance photograph of the cladding made of Cr—Al thin film-deposited Zircaloy-4.

As shown in FIG. 7, it was confirmed that, when a bias voltage applied to a target during arc ion plating was 30 V, the Cr—Al thin film peels off from an interface.

Figure 8:
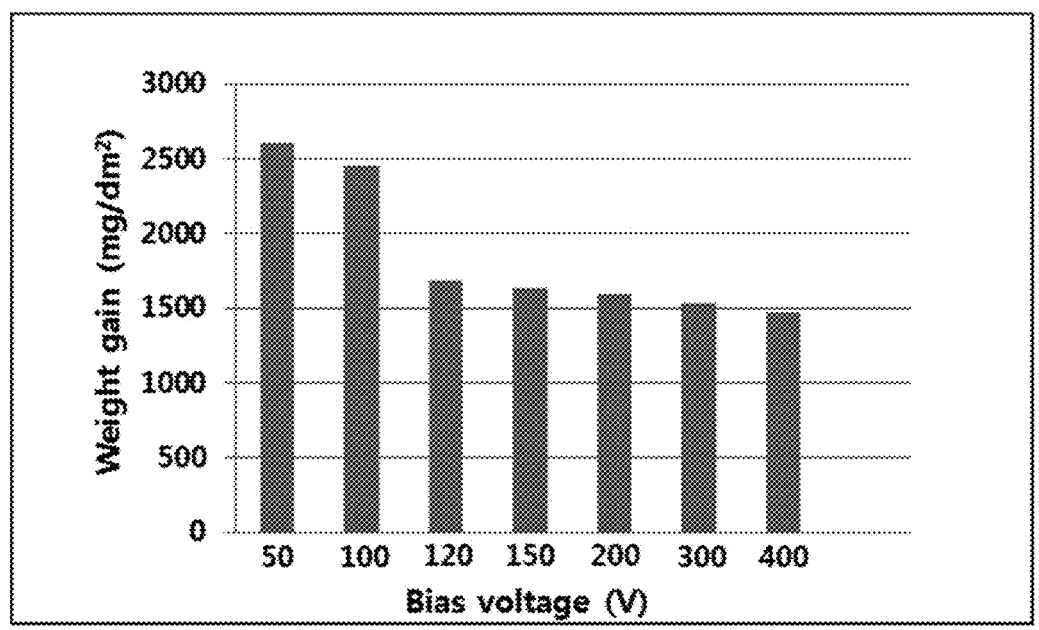
FIG. 8 is a graph illustrating a comparison result of weight increase amounts when a Cr—Al thin film was deposited on a cladding made of Zircaloy-4 in the same manner as in Example 1 while variously adjusting a bias voltage applied to a target during arc ion plating in a range from 50 to 400 V, followed by oxidization at 1200° C. for 2,000 seconds under a steam atmosphere condition.

FIG. 8 is a graph illustrating a comparison result of weight increase amounts when a Cr—Al thin film was deposited on a cladding made of Zircaloy-4 in the same manner as in Example 1 while variously adjusting an applied bias voltage in arrange from to 50 to 400 V in a state in which a current applied to a target during arc ion plating was fixed at 90 A, followed by oxidization at 1200° C. for 2,000 seconds under a steam atmosphere condition.

As shown in FIG. 8, it was confirmed that a weight increase amount was relatively large under a high-temperature steam condition when a bias voltage applied to a target during arc ion plating was 50 to 100 V, but a weight increase amount was greatly decreased under the high-temperature steam condition when a bias voltage applied to a target during arc ion plating was 120 V or higher.

Figure 9:
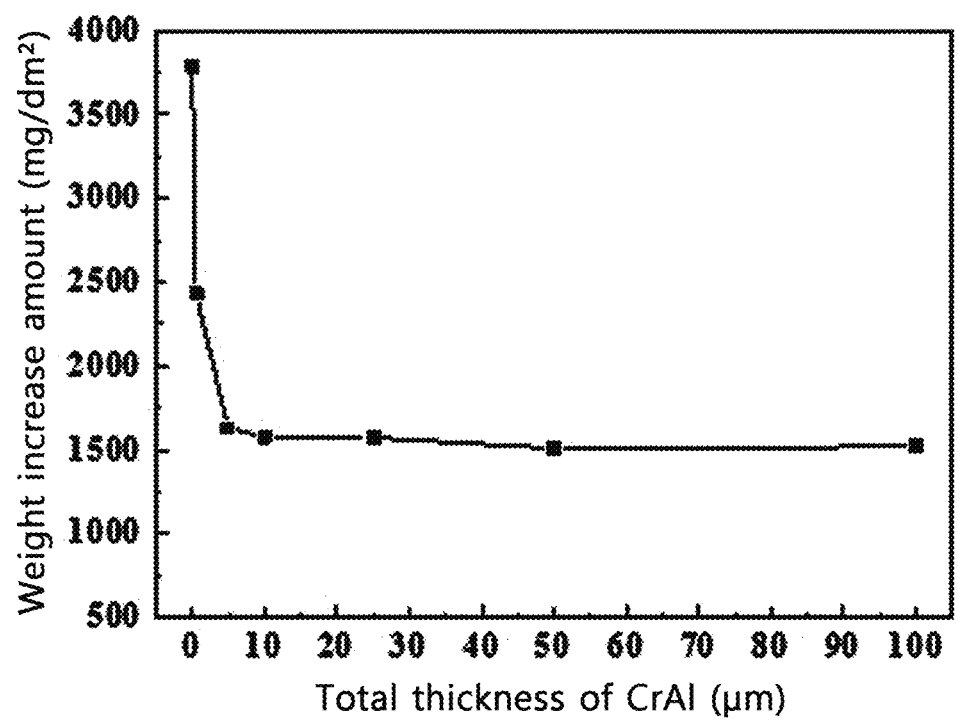
FIG. 9 is a graph illustrating a comparison result of weight increase amounts when a Cr—Al thin film was deposited on a cladding made of Zircaloy-4 in the same manner as in Example 1 while variously adjusting the thickness of the thin film, followed by oxidization at 1200° C. for 2,000 seconds under a steam atmosphere condition.

FIG. 9 is a graph illustrating a comparison result of weight increase amounts when a Cr—Al thin film was deposited on a cladding made of Zircaloy-4 in the same manner as in Example 1 while variously adjusting the thickness of the thin film, followed by oxidization at 1200° C. for 2,000 seconds under a steam atmosphere condition.

As shown in FIG. 9, it was confirmed that, when the thickness of the thin film was 5 µm or more, a weight increase amount was greatly reduced under a high-temperature steam condition.

Figure 10:
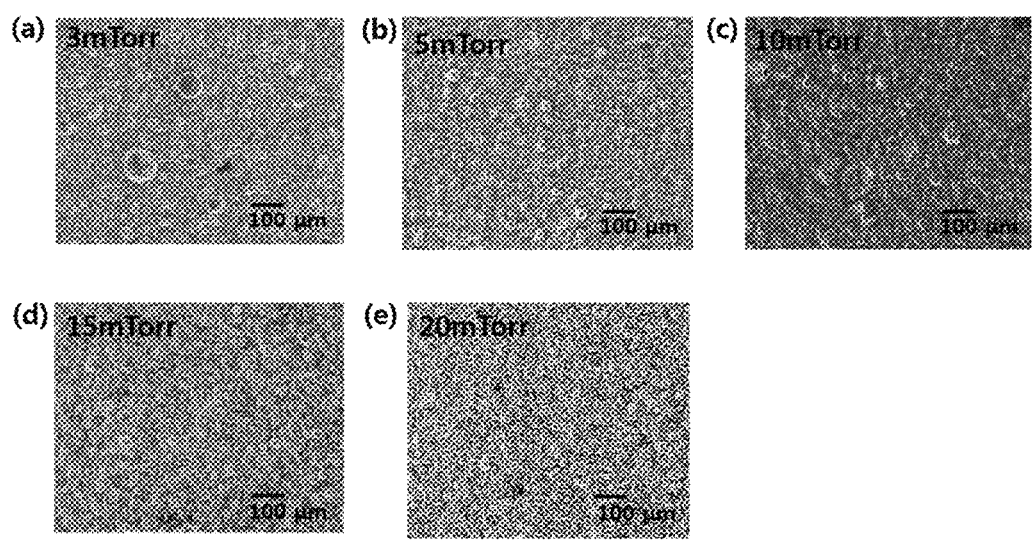
FIG. 10 illustrates SEM photographs of surface appearances of claddings, made of Zircaloy-4, deposited with a Cr—Al thin film. Particularly, the Cr—Al thin film was deposited on a cladding made of Zircaloy-4 in the same manner as in Example 1 while variously adjusting a working pressure in a range from 3 to 20 mTorr during deposition.

FIG. 10 illustrates SEM photographs of surface appearances of claddings made of Cr—Al thin film-deposited Zircaloy-4. Particularly, the Cr—Al thin film was deposited on a cladding made of Zircaloy-4 in the same manner as in Example 1 while variously adjusting a working pressure in a range from 3 to 20 mTorr during deposition.

In addition, Table 2 shows, when Cr—Al thin films were deposited on claddings made of Zircaloy-4 in the same manner as in Example 1, but a working pressure during deposition was adjusted to 5 mTorr, 10 mTorr and 20 mTorr, an arithmetical average roughness (Ra) of each of the claddings made of Zircaloy-4, and on which the Cr—Al thin film was deposited (measurement equipment: Surftest, V-500).

TABLE 2

|  | 5 mTorr | 10 mTorr | 20 mTorr |
| --- | --- | --- | --- |
| Arithmetical average roughness (Ra) | 4.9436 µm | 3.8996 µm | 2.153 µm |

As shown in FIG. 10 and Table 2, it was confirmed that a surface roughness was decreased with an increasing working pressure during deposition. This is because the probability that ions and droplets generated in a target collide with gas molecules increases with an increasing working pressure during the deposition. Accordingly, a surface roughness (Ra) was confirmed to be 5 µm or less when the working pressure was 5 to 20 mTorr during deposition.

The aforementioned description of the present invention is provided by way of example and those skilled in the art will understand that the present invention can be easily changed or modified into other specified forms without change or modification of the technical spirit or essential characteristics of the present invention. Therefore, it should be understood that the aforementioned examples are only provided by way of example and not provided to limit the present invention.

The invention claimed is:

1. A method of manufacturing a zirconium alloy cladding with improved oxidation resistance at a high temperature, the method comprising:
    (a) manufacturing a target comprising Cr and Al; and
    (b) depositing a Cr—Al thin film on a zirconium alloy cladding through arc ion plating in which a current and a bias voltage are applied to the target, wherein the content of Al in the target is 7% by weight to 23% by weight;
    wherein, in step (b), the applied current is 30 A to 120 A and the applied bias voltage is 120 V to 400 V,
    wherein, in step (b), a working pressure during the deposition is maintained at 5 mTorr to 20 mTorr, and
    wherein an arithmetical average roughness (Ra) of the Cr—Al thin film deposited in step (b) is 5 µm or less.

2. The method according to claim 1, wherein, in step (b), the deposition is performed at 200° C. to 300° C.

3. The method according to claim 1, wherein, in step (b), the deposition is performed at a rate of 2 µm/h to 15 µm/h.

4. The method according to claim 1, wherein, after the zirconium alloy cladding and the Cr—Al thin film deposited in step (b) is-being oxidized at 1200° C. for 2,000 seconds under a steam atmosphere condition, a weight increase of the zirconium alloy cladding and the Cr—Al thin film deposited in step (b) ranges 1 mg/dm$^2$ to 3,000 mg/dm$^2$.

* * * * *